(12) United States Patent
Miyauchi et al.

(10) Patent No.: US 6,651,215 B2
(45) Date of Patent: *Nov. 18, 2003

(54) VITERBI DECODING APPARATUS AND VITERBI DECODING METHOD

(75) Inventors: Toshiyuki Miyauchi, Tokyo (JP); Masayuki Hattori, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,453

(22) Filed: Dec. 17, 1998

(65) Prior Publication Data

US 2001/0049809 A1 Dec. 6, 2001

(30) Foreign Application Priority Data

Dec. 19, 1997 (JP) ............................... 9-351435

(51) Int. Cl.[7] ............................................. H03M 13/41
(52) U.S. Cl. ...................................................... 714/795
(58) Field of Search ........................................ 714/795

(56) References Cited

U.S. PATENT DOCUMENTS

| | | | |
|---|---|---|---|
| 4,905,317 A | 2/1990 | Suzuki et al. ................. | 341/51 |
| 5,712,880 A | * 1/1998 | Rim et al. .................... | 375/341 |
| 5,822,341 A | * 10/1998 | Winterrowd et al. ....... | 371/43.7 |

FOREIGN PATENT DOCUMENTS

EP          0 798 867 A2    10/1997    .......... H03M/13/00

OTHER PUBLICATIONS

Feygin et al., "Architectural Tradeoffs for Survivor Sequence Memory Management in Viterbi Decoders", IEEE Transactions on Communications, vol. 41, No. 3, Mar. 1993, pp. 425–429.*

Feygin et al., "A VLSI Implementation of a Cascade Viterbi with Traceback", ISCAS '93, pp. 1945–1948, May 1993.*

Rim et al., "Memory Mangement in High–Speed Viterbi Decoders", Workshop on VLSI Signal Processing, VIII, pp. 511–520, Sep. 1995.*

Joeressen et al., "Viterbi Decoding with Dual Timescale Traceback Processing", PIMRC '95, pp. 213–217, Sep. 1995.*

Horwitz et al., "A Generalized Design Technique for Traceback Survivor Memory Management in Viterbi Decoders", COMSIG '97, pp. 63–68, Sep. 1997.*

"Architectural Tradeoffs for Survivor Sequence Memory Management in Viterbi Decoders", 8089 IEEE Transactions on Communications 41(Mar.1993), No. 3, New York, by Gennady Feygin and P.G. Gulak, Jul. 26, 1993, p. 425–429.

"An Area–Efficient Path Memory Structure for VLSI Implementation of High Speed Viterbi Decoders", 8220 Integration, the VLSI Journal 12(Nov.1991), No. 1, Amsterdam, NL, p. 79–91.

* cited by examiner

Primary Examiner—Stephen M. Baker
(74) Attorney, Agent, or Firm—Sonnenschein, Nath & Rosenthal LLP

(57) ABSTRACT

Three dual-port RAMs of the number of bits=8 and the number of words=4 are provided in a path memory circuit. Path selection information is sequentially written into the three RAMs every clock in accordance with the control of a control circuit. On the other hand, the path selection information is read out every clock from the RAMs in accordance with the control of the control circuit and is inputted as read path selection information or the like to a tracing circuit. The tracing circuit executes the tracing operation as many as three times on the basis of the read path selection information and trace starting state information which is formed by the control circuit. On the basis of a tracing result, the decoding data and a trace starting state in the subsequent clock are obtained.

6 Claims, 18 Drawing Sheets

(4) TRACE PATH AND DECODE (3) NO ACCESS (1) WRITE PATH INFORMATION (2) TRACE PATH

SEQUENTIALLY SWITCH

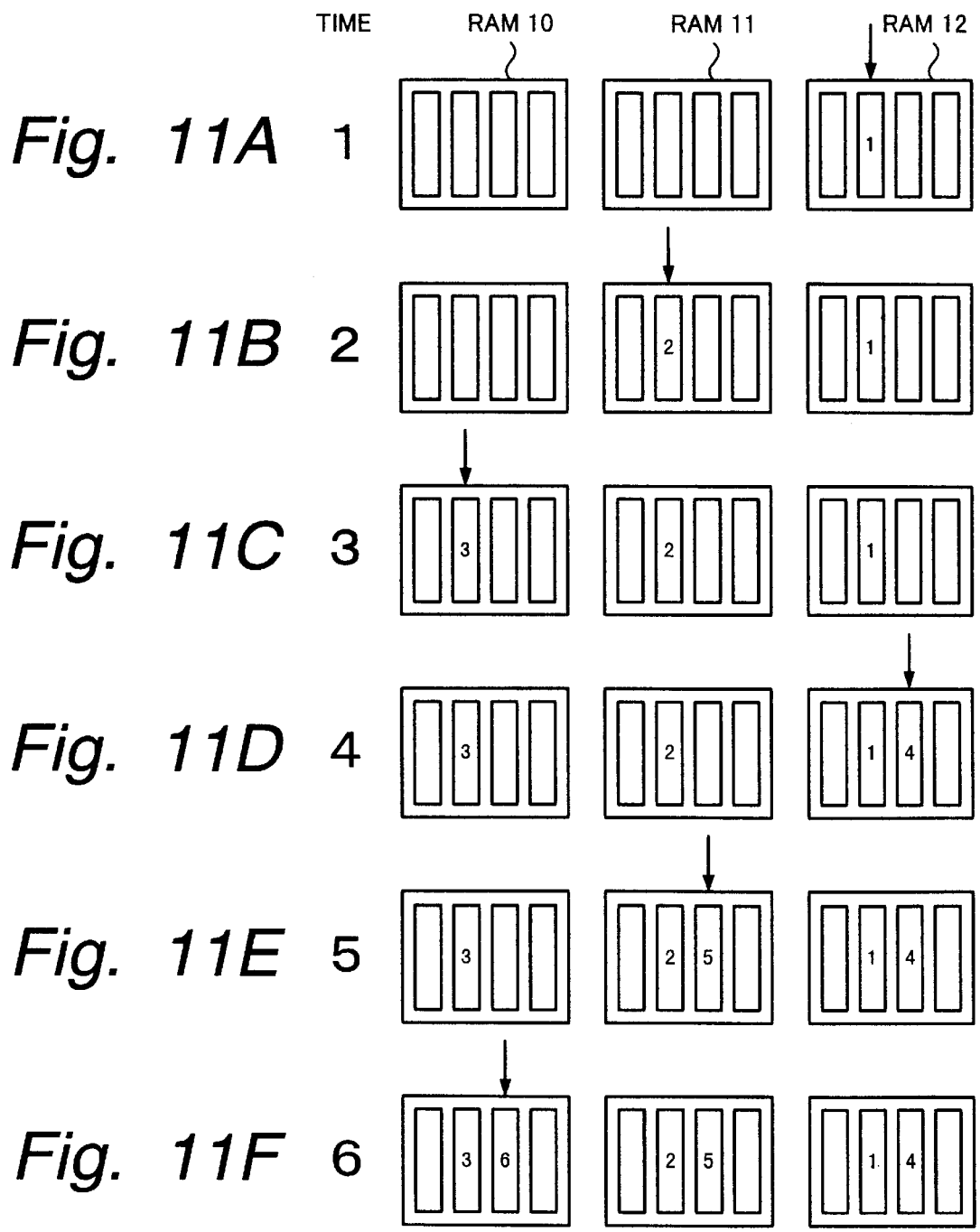

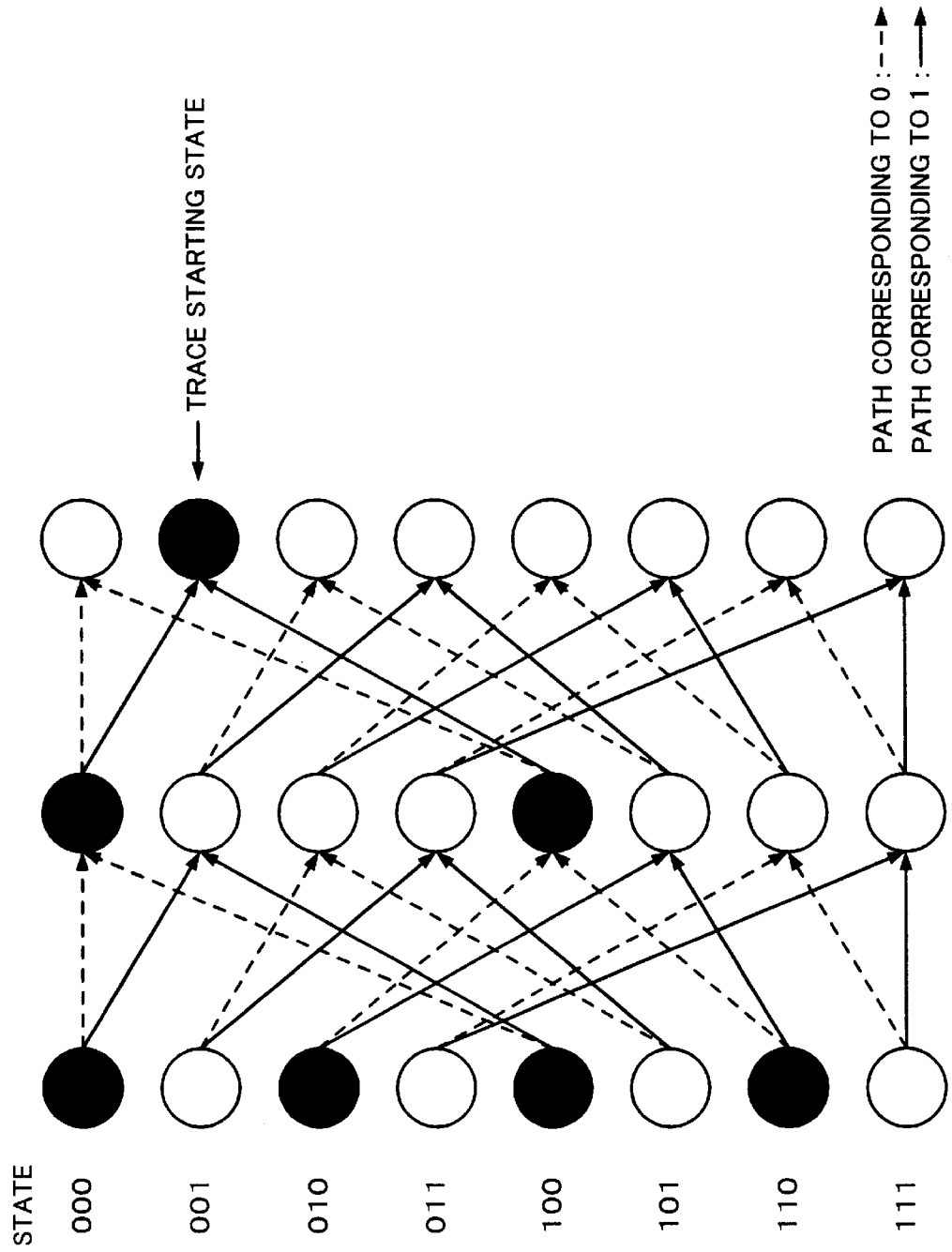

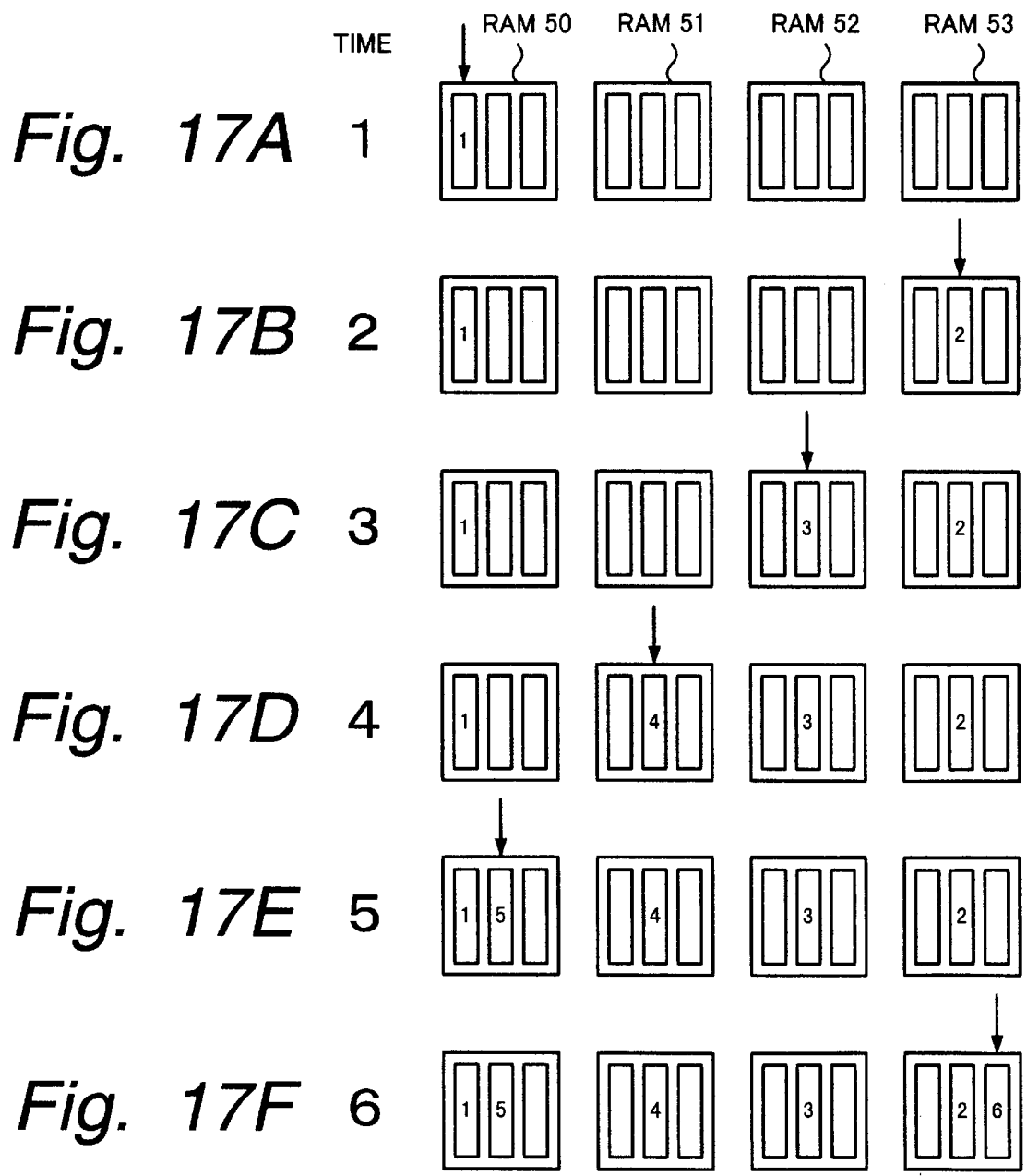

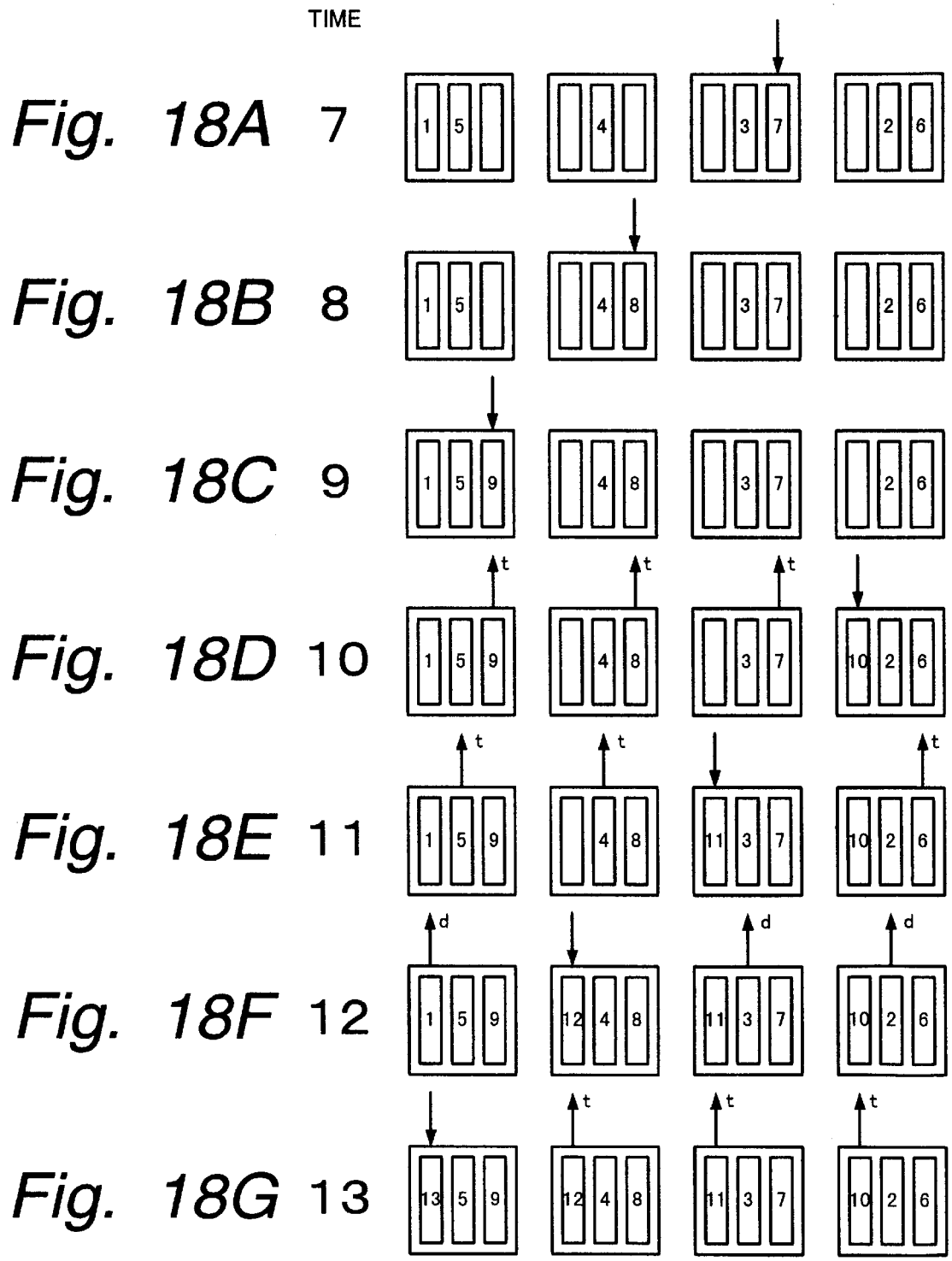

VITERBI DECODING APPARATUS AND VITERBI DECODING METHOD

BACKGROUND OF THE INVENTION

1. Field of the Invention

The invention relates to a Viterbi decoding apparatus and a Viterbi decoding method which is used in a maximum likelihood decoding method of a convolution code that is used in, for example, a satellite broadcasting or the like.

2. Description of the Related Art

As a method of decoding a convolution code, a Viterbi decoding method has been known. The Viterbi decoding method is a maximum likelihood decoding method for the convolution code, and by selecting a series that is the closest to a received code series (hereinafter, such a series is referred to as a maximum likelihood path) among a code series which can be formed from an encoder on the transmission side, an error correction is performed. That is, a transition diagram (hereinafter, referred to as a trellis) which is formed on the basis of an encoding method by the encoder on the transmission side is used as a prerequisite and, for example, a path whose Hamming distance from the received code series is the shortest is selected as a maximum likelihood path from transitions which can occur on the transition diagram.

A Viterbi decoding apparatus for performing a Viterbi decoding method comprises: a branch metric calculating circuit for calculating a branch metric, namely, a Hamming distance between a path which reaches each state on the trellis and the received code series in accordance with a clock; an ACS circuit for calculating state metrics on the basis of the branch metric, comparing values of the state metrics, and selecting a maximum likelihood path; a normalizing circuit for normalizing the values of the state metrics; a state metric storing circuit for storing the values of the state metrics; and a path memory circuit for forming decoding data in accordance with a selection result by the ACS.

As a path memory circuit, there are two kinds of circuits: namely, a circuit for performing a register exchange method for transferring the path selection contents by using a register train; and a circuit for performing a method of storing the path selection contents by using RAMs, tracing the stored contents, and decoding. Those two kinds of methods will now be described hereinbelow.

In the register exchange method which is generally used in a Viterbi decoding apparatus, memory cells each comprising a selector and a register are arranged on the trellis in the path memory circuit and the contents in the register are transferred on the basis of the path selection information that is outputted from the ACS circuit. An example of a construction of the memory cell is shown in FIG. 1. An example of an arrangement of memory cells in the case where a restriction length=3 is shown in FIG. 2 (in FIG. 2, the memory cell is shown as MS). With such a construction, information corresponding to a survival path from each state is preserved in the register of each memory cell. The registers of the number of stages corresponding to a traceback depth are arranged using the memory cells. Among outputs at the final stages, the output of the maximum likelihood state is selected, thereby selecting the information for the maximum likelihood path and outputting decoding data.

Although such a register exchange method has an advantage such that the high speed operation can be performed, there is a drawback such that a circuit scale is extremely large as the trace back depth becomes long. Particularly, since an application such that the traceback depth exceeds 100 also has appeared in recent years, the enlargement of the circuit scale becomes a serious problem.

In recent years, the method of decoding by storing path information by using RAMS (Random Access Memories) as many as the traceback depth and tracing the stored information has actively been studied. Such a method is called a trace-back method hereinbelow.

According to the trace-back method, a path memory circuit whose circuit scale is fairly smaller than that of the register exchange method can be constructed. However, in the conventional apparatus for performing the trace-back method, the path memory circuit still has a large circuit scale.

The invention has been proposed in consideration of such a situation. It is, therefore, an object of the invention to provide a Viterbi decoding apparatus and a Viterbi decoding method in which a circuit scale is small and a high speed operation can be performed.

SUMMARY OF THE INVENTION

The invention is a Viterbi decoding apparatus which has a path memory for storing selection information of a path in each transition state of a convolution code by using a rewritable memory and traces the information held in the path memory by an amount corresponding to a trace-back depth, thereby performing a Viterbi decoding, wherein a plurality of rewritable memories and memory control means for controlling accesses to the plurality of rewritable memories are comprised, and tracing operations as many as a plurality of times for a period of time of one clock and decoding are performed.

Further the invention is a Viterbi decoding method of storing selection information of a path in each transition state of a convolution code and tracing the stored information by an amount corresponding to a traceback depth, thereby performing a Viterbi decoding, comprising a tracing step of performing tracing operations as many as a plurality of times for a period of time of one clock, using a plurality of rewritable memories provided in a path memory.

According to the invention as mentioned above, by performing the decoding by executing the tracing operation as many as a plurality of times for the period of time of one clock, the total number of words in the RAM can be reduced.

When the path selection information is written, it is sequentially written into a plurality of rewritable memories. Upon tracing, by sequentially reading out the information from the plurality of memories and performing the tracing operation as many as the plurality of times, the tracing operation as many as the plurality of times can be performed while setting the number of times of access to each memory for each clock to one time.

Further, among the outputs of the plurality of memories, the information of the state having a possibility such that it is traced is preliminarily selected on the basis of the trace starting state and the tracing operation is executed with regard to the selected information of the state. Thus, even if the tracing operation as many as the plurality of times is executed, an increase in delay can be minimized.

The above, and other, objects, features and advantage of the present invention will become readily apparent from the following detailed description thereof which is to be read in connection with the accompanying drawings.

BRIEF DESCRIPTION OF THE DRAWINGS

FIGS. 11A to 11F are schematic diagrams for more specifically explaining the memory operation in the embodiment of the invention;

FIG. 13 is a schematic diagram for explaining states having a possibility such that they are traced;

FIGS. 17A to 17F are schematic diagrams for more specifically explaining the memory operation in the other embodiment of the invention; and FIGS. 18A to 18G are schematic diagrams for more specifically explaining the memory operation in the other embodiment of the invention.

DETAILED DESCRIPTION OF THE PREFERRED EMBODIMENTS

Figure 3:
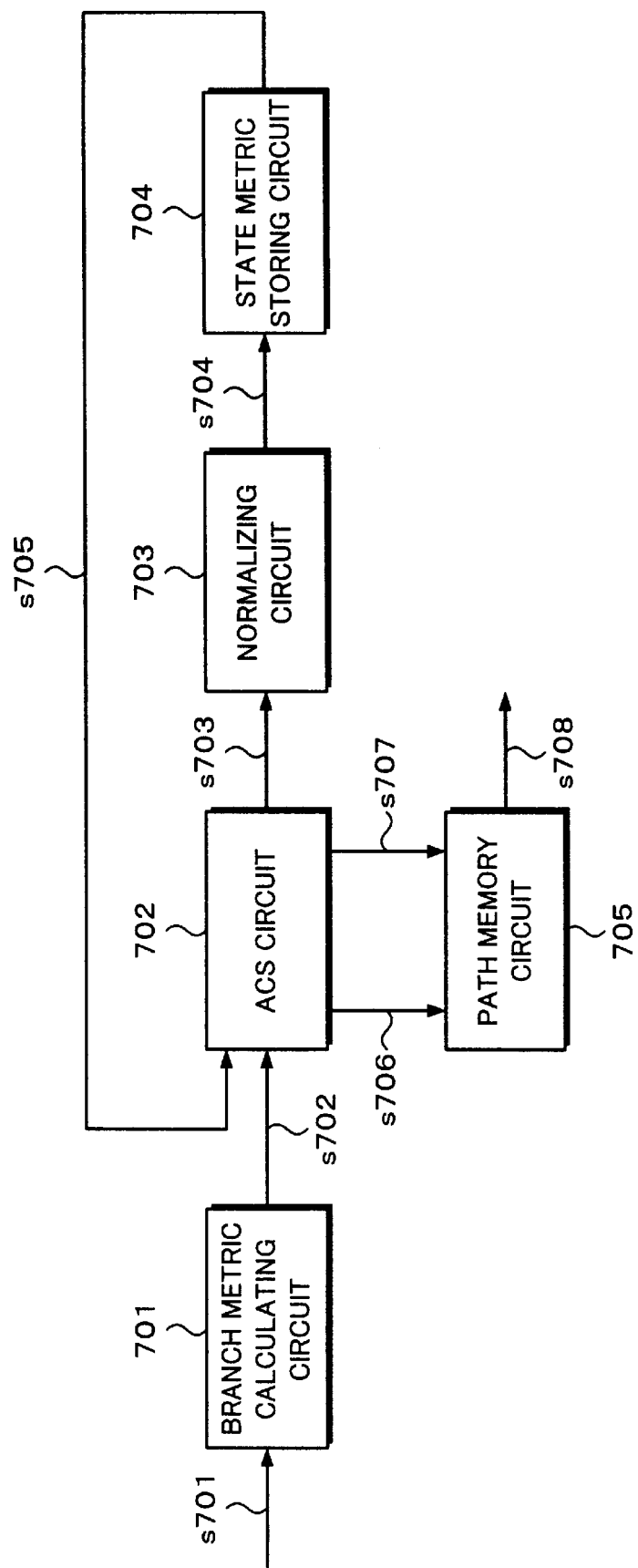
FIG. 3 is a block diagram for explaining a whole construction of an embodiment of the invention.

The first embodiment of the invention will now be described hereinbelow with reference to the drawings. First, a whole construction of the first embodiment of the invention will now be described with reference to FIG. 3. The first embodiment of the invention comprises: a branch metric calculating circuit 701; an ACS circuit 702; a normalizing circuit 703; a state metric storing circuit 704; and a path memory circuit 705. When data received through a transmission path is inputted from the transmission side, a maximum likelihood path is selected from a code series which can be formed from an encoder on the transmission side and decoding data is formed on the basis of selection contents.

Figure 4:
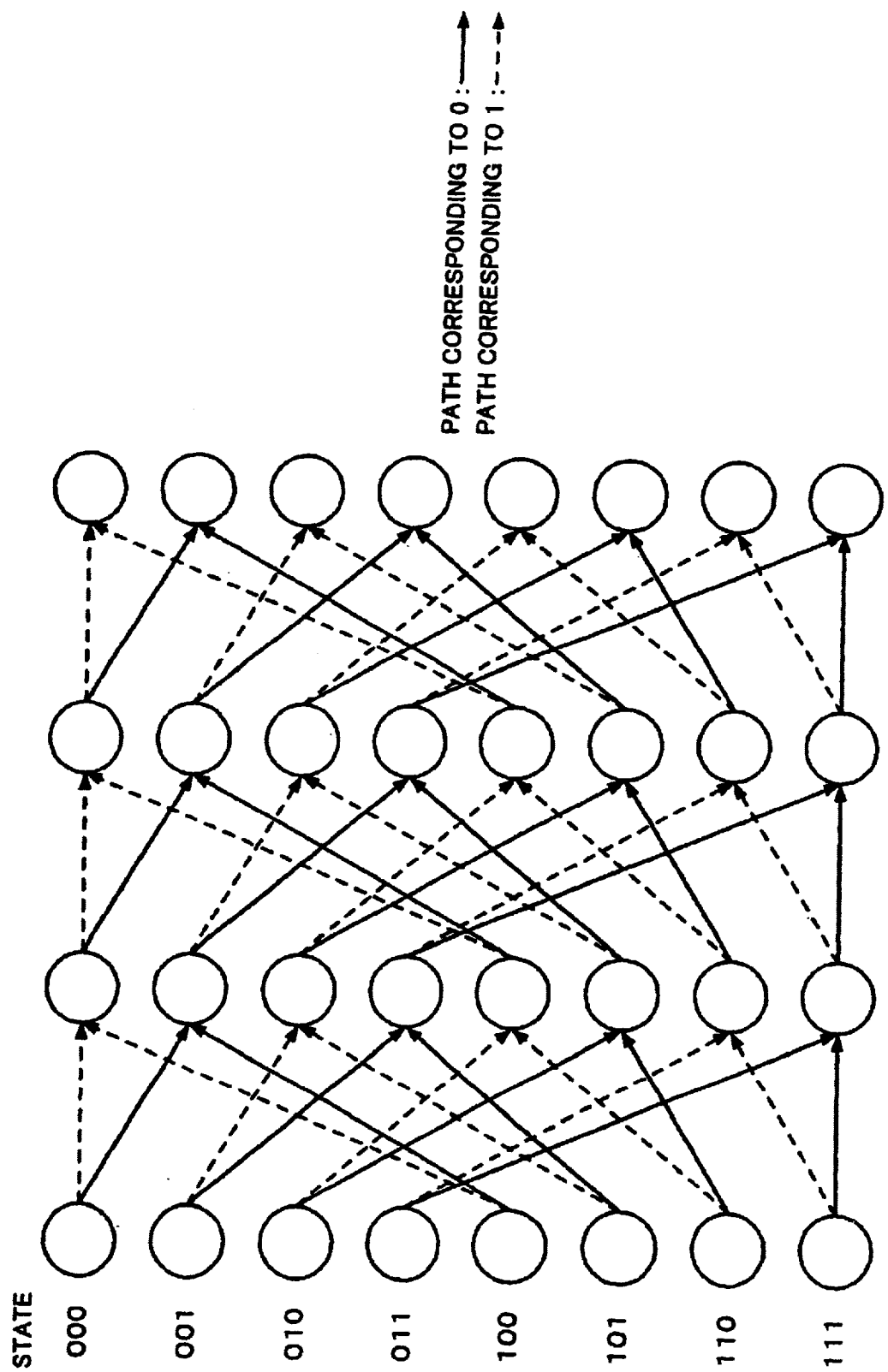
FIG. 4 is a schematic diagram for explaining a transition diagram in the case where a constraint length=4.

That is, for example, a transition diagram (hereinafter, referred to as a trellis) as shown in FIG. 4 which is formed on the basis of an encoding method by the encoder on the transmission side is used as a prerequisite and, for example, a path whose Hamming distance from the received code series is the shortest is selected as a maximum likelihood path from the transitions which can occur on the transition diagram.

When a reception data signal s701 is inputted, the branch metric calculating circuit 701 calculates a branch metric of the reception data and outputs a calculation result as a branch metric signal s702. On the basis of the branch metric signal s702 and a state metric signal s705 which is inputted from the state metric storing circuit 704, the ACS circuit 702 adds the branch metric and the state metric to each of two paths which join a certain state, compares their addition values, selects the addition value having a higher likelihood on the basis of a comparison result, and sets it as a new state metric.

The contents of such a selection are outputted as path selection information s706. The number of the state having the minimum state metric is outputted as a maximum likelihood state signal s707. The newly obtained state metric is outputted as a new state metric signal s703.

Figure 1:
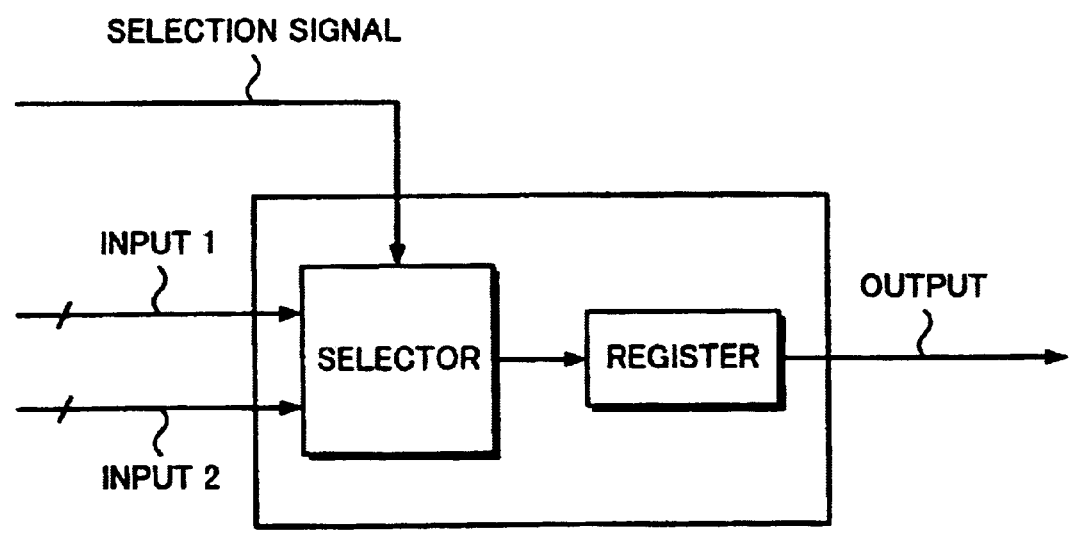
FIG. 1 is a schematic diagram for explaining a memory cell of a path memory in a register exchange method.
Figure 2:
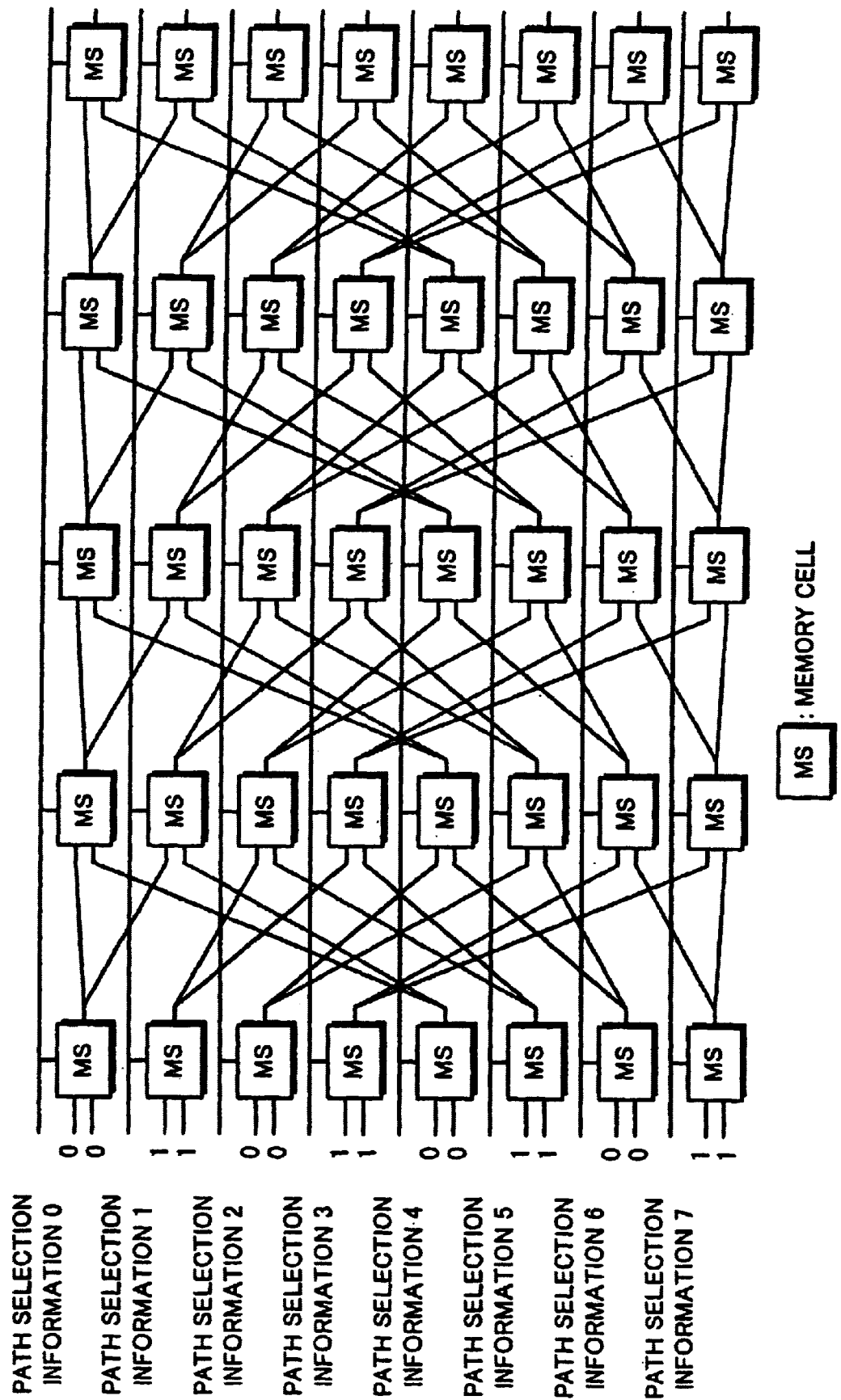
FIG. 2 is a schematic diagram for explaining an arrangement of the memory cells in the path memory in the register exchange method.

A selecting method of the path will now be described with respect to a case where a constraint length=4 as an example. The trellis of FIG. 2 shows an example of a trellis in the case where it has eight states 000, 001, 010, 011, 100, 101, 110, and 111 and a constraint length=4. An arrow indicates a path which can occur every time slot. A path corresponding to the decoding data '0' is shown by a broken line. A path corresponding to the decoding data '1' is shown by a solid line. Two paths which join exist in all of the states every time slot. Therefore, for each of the two paths which join a certain state, the Hamming distance (branch metric) between the reception signal and the paths and accumulation sums (state metrics) of the branch metrics so far are added and compared. A path having a higher likelihood is selected on the basis of a comparison result.

The normalizing circuit 703 normalizes by using a method whereby the minimum state metric is subtracted from the new state metric signal s703 which is outputted from the ACS circuit 702 or the like, thereby setting to a value within a preset range and outputting it as a normalized state metric signal s704. The state metric storing circuit 704 stores the normalized state metric signal s704 which is outputted from the normalizing circuit 703 and returns it as a state metric signal s705 to the ACS circuit 702.

Figure 5:
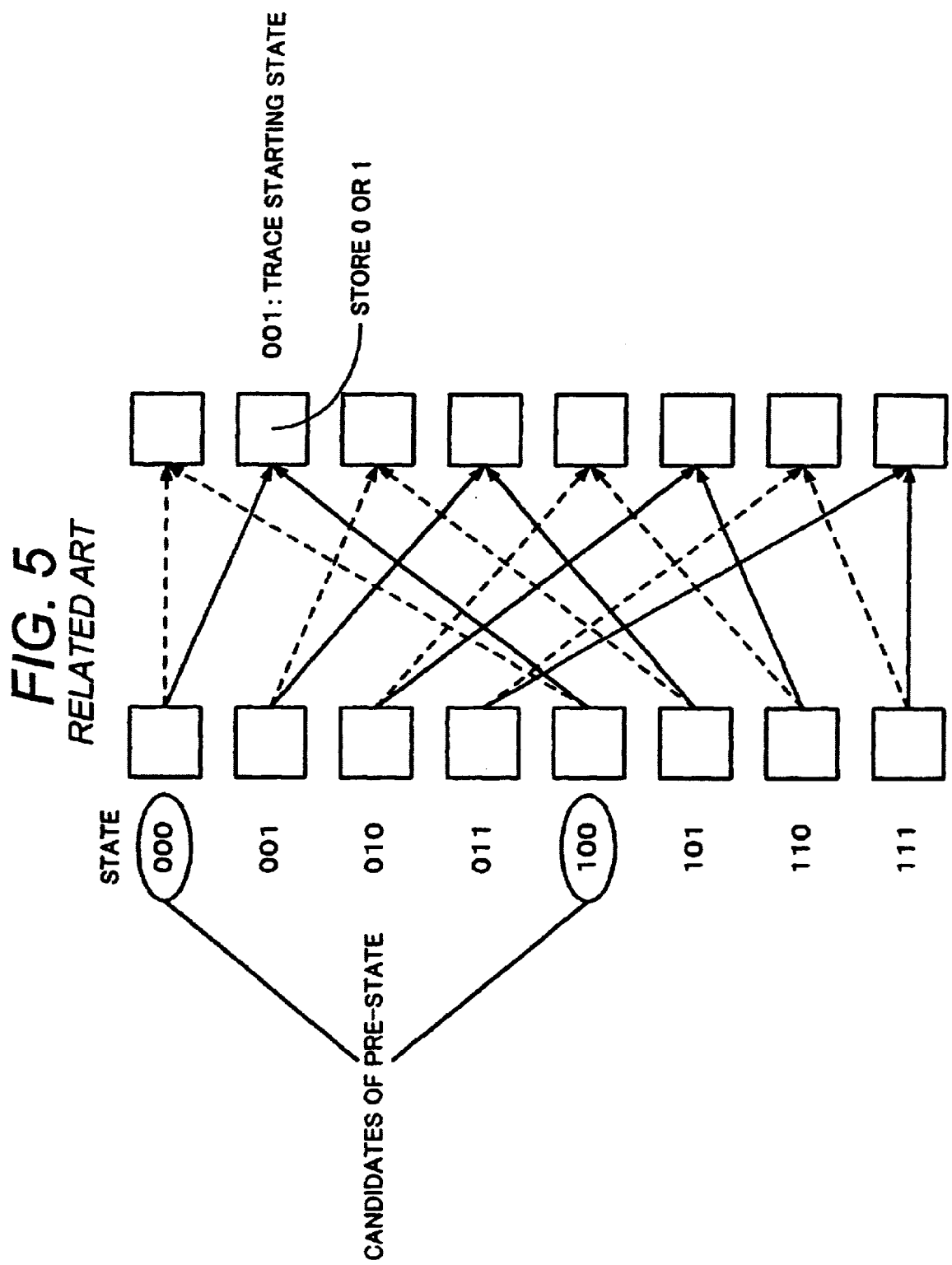
FIG. 5 is a schematic diagram for explaining a principle of tracing in a trace-back method.

The path memory circuit 705 executes the decoding operation by the trace-back method and is constructed so as to reduce an area of the RAMs as compared with the standard path memory for performing the trace-back method as mentioned above. Prior to describing the path memory circuit 705, to make it easy to understand, the tracing operation in the general trace-back method will now be described with respect to a case where a constraint length=4 as an example. In FIG. 5, a case of tracing from state 01 will be considered. States having a possibility of transition to state 001 are state 000 and state 100. '0' has been stored in the path memory when the path on the state 000 side had been selected. '1' (namely, the most significant bit of the pre-state) has been stored in the path memory when the path on the state 100 side had been selected.

Figure 6:
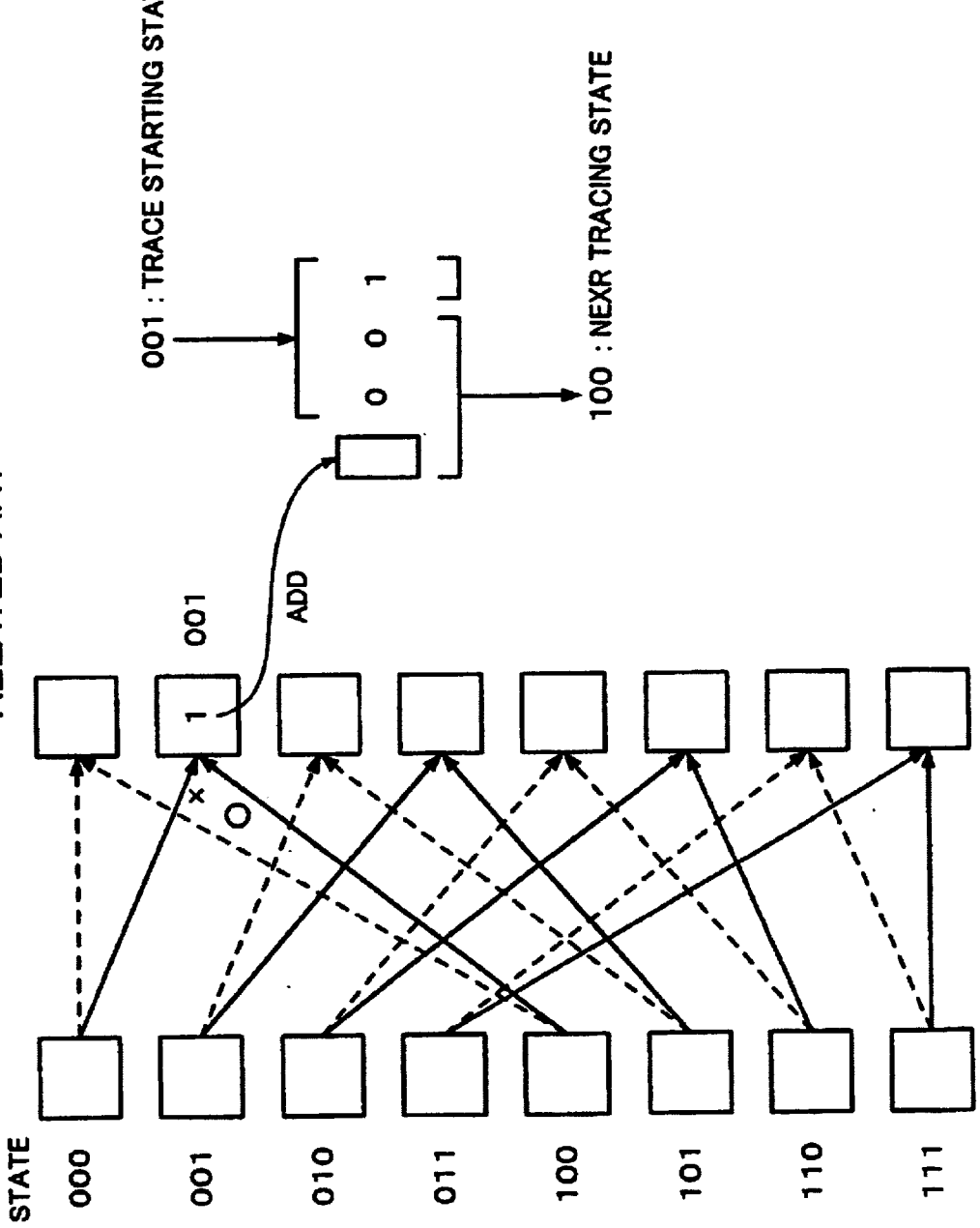
FIG. 6 is a schematic diagram for explaining a method of tracing in the trace-back method.

Even in case of transferring from any state, the input is 1 and it is expressed by the least significant bit of state 001. By the above description, it is sufficient to execute the tracing operation as follows. That is, as shown in FIG. 6, the least significant bit of a trace starting state to start the tracing is used as a decoding bit. The number of the next tracing state to trace subsequently to the trace starting state is formed by newly adding the bit in the path memory as a most significant bit for a range from the most significant bit to the second lowest bit of the trace starting state. By such an operation, the selected path can be traced from the state having the minimum state metric.

Figure 7D:
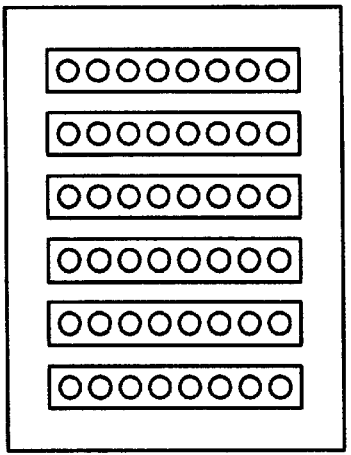
FIGS. 7A to 7D are schematic diagrams for explaining a role of each RAM in a general trace-back method which has conventionally been used.
Figure 7C:
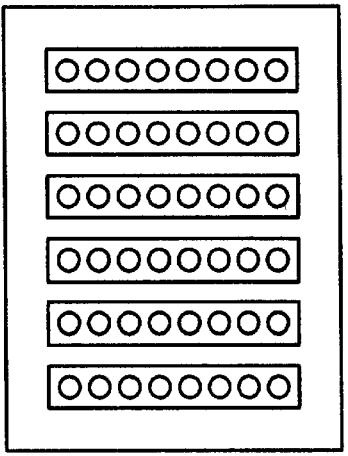
Figure 7A:
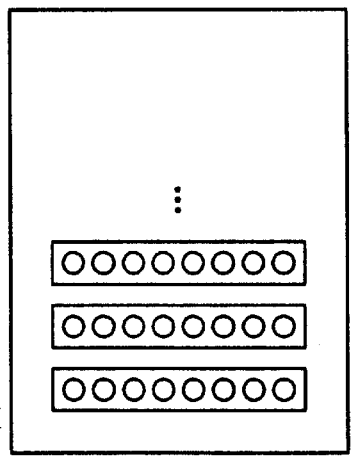
Figure 7B:
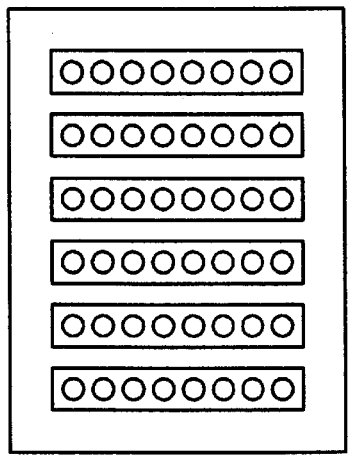

To make the Viterbi decoding apparatus operative at a high speed, the access to the RAM can be performed only once every clock. The operation of the path memory circuit to perform the decoding by the access of once for each RAM will now be described with respect to a case of using four single-port memories as an example. In the following description, a constraint length of a code=4 and a trace back depth=6. In this case, as four single-port memories, memories each having bits numbering as many as the number of states (eight bits in this case) and words numbering as much as the trace back depth (in this case, six words) are used. The path selection information as many as the number of states is inputted from the ACS circuit to the path memory every clock. In the four RAMs, the following four roles of (1) to (4) are sequentially switched every clock (six clocks here) as much as the traceback depth (refer to FIGS. 7A and 7D).

(1) The path selection information is sequentially written.
(2) The tracing is sequentially performed on the basis of the written path selection information. The decoding is not performed.
(3) No access
(4) The tracing is sequentially performed from a tracing result in (2) and a decoding bit is outputted.

Figure 8:
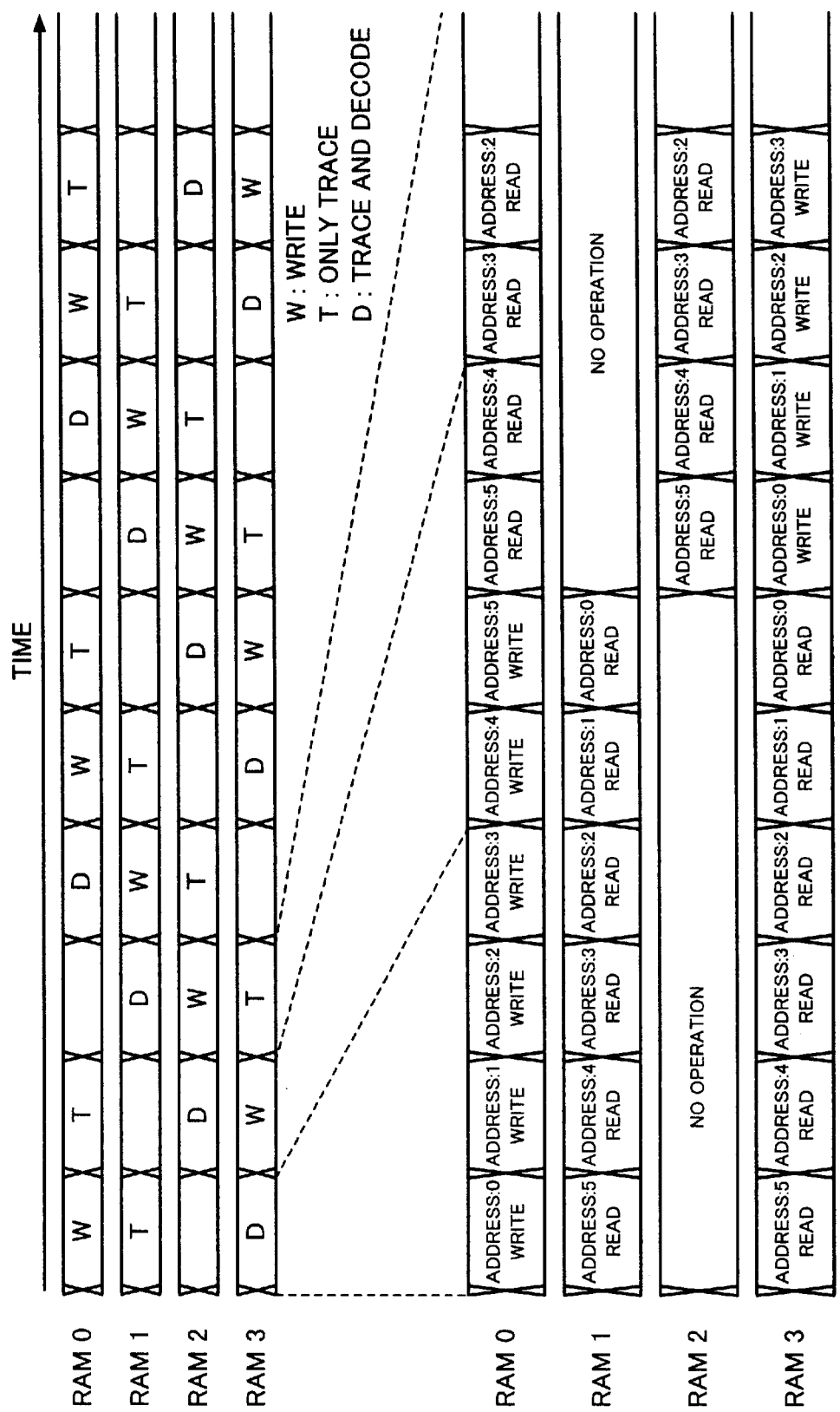
FIG. 8 is a schematic diagram for explaining the memory operation in the general trace-back method which has conventionally been used.

The operation of each RAM based on such a switching operation is shown in FIG. 8. By the memory operation as mentioned above, a Viterbi decoding apparatus which can perform a high speed decoding even by using RAMs can be constructed. According to such a general trace-back method, the circuit scale can be fairly reduced as compared with that in case of performing the register exchange method. However, since four RAMs having the words of the number as many as the traceback depth are necessary, the total number of words of the RAMs is equal to (the cut length)×4 and the large circuit scale is still needed. Therefore, the embodiment of the invention intends to further reduce the circuit scale of the path memory circuit.

Figure 9:
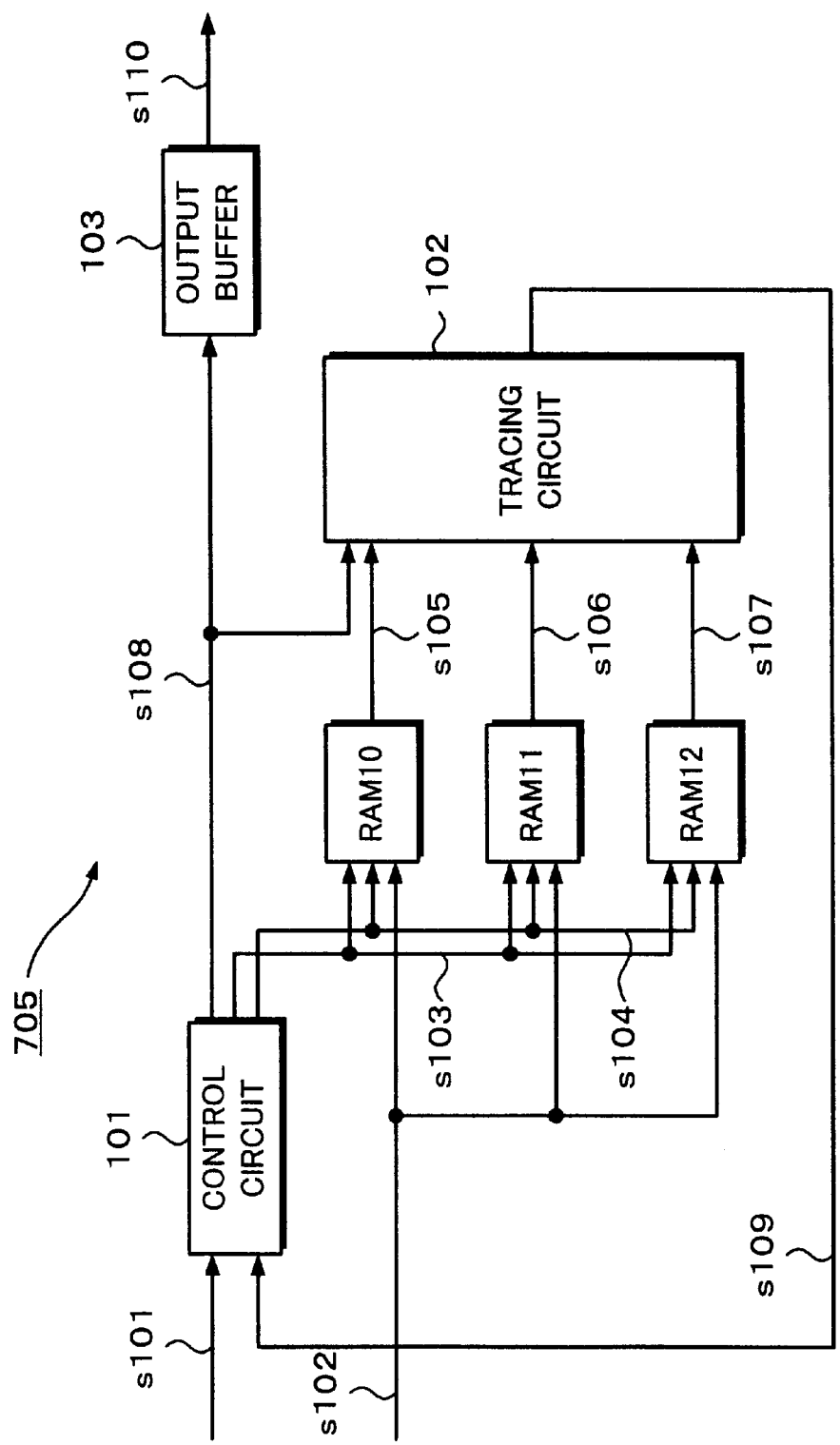
FIG. 9 is a block diagram for explaining a path memory circuit in an embodiment of the invention.

Referring to FIG. 9, the path memory circuit 705 in the embodiment of the invention will now be described. The path memory circuit 705 is a path memory circuit which has three dual-port RAMs of 1-write and 1-read of the number of bits=8 and the number of words=4 and executes the tracing operation as many as three times for a period of time of one clock in case of performing the decoding of the traceback depth=6 for the code of the constraint length=4.

Path selection information s102 which is inputted from the ACS circuit is sequentially stored into the RAMs every clock in accordance with the order of RAM 12→RAM 11→RAM 10→RAM 12→RAM 11 ••• on the basis of a write control signal s103 which is generated from a control circuit 101. In response to a read control signal s104 which is generated by the control circuit 101, the path selection information is read out from all of the RAMs 10, 11, and 12 every clock and read path selection information s105, s106, and s107 is inputted to a tracing circuit 102.

Figure 10:
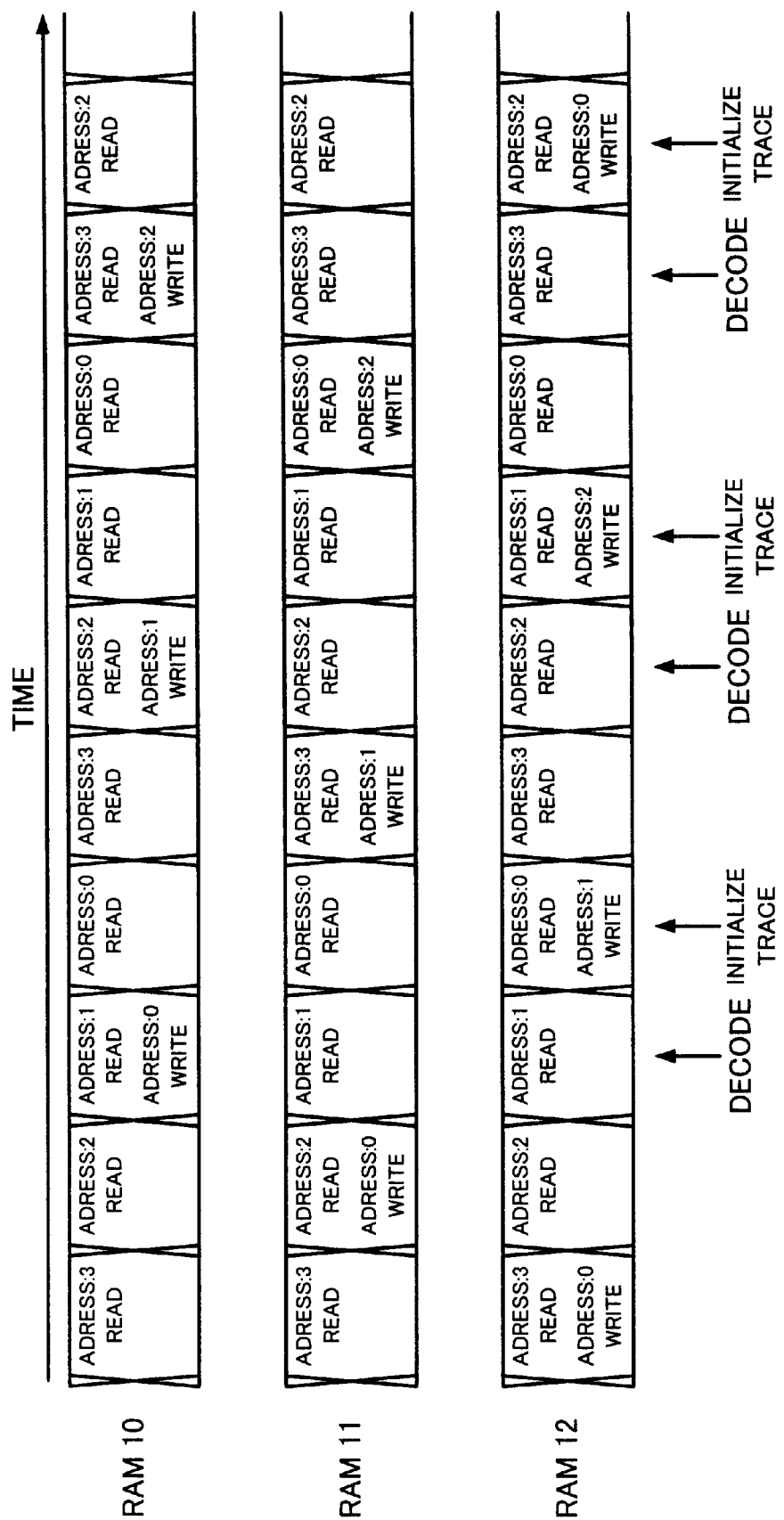
FIG. 10 is a schematic diagram for explaining the memory operation in the embodiment of the invention.
Figure 12A:
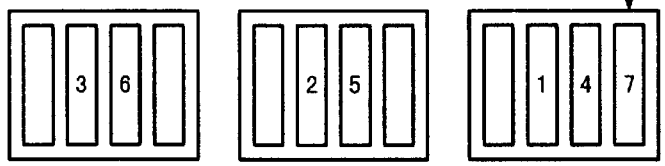
FIGS. 12A to 12G are schematic diagrams for more specifically explaining the memory operation in the embodiment of the invention.
Figure 12B:
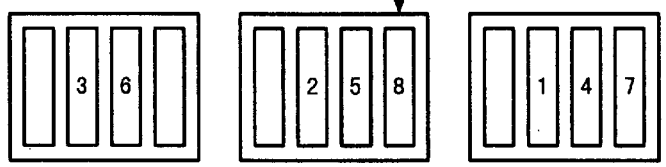
Figure 12C:
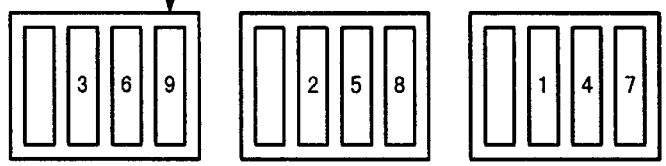
Figure 12D:
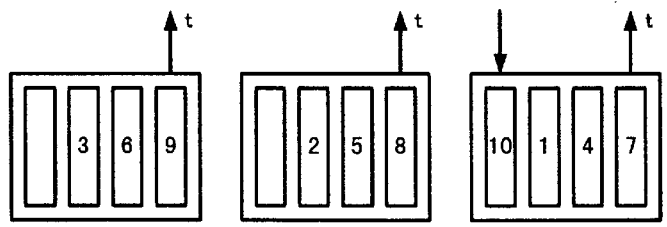
Figure 12E:
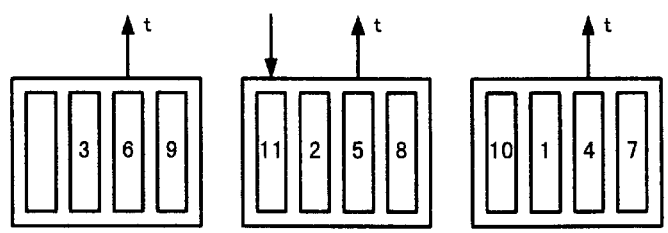
Figure 12F:
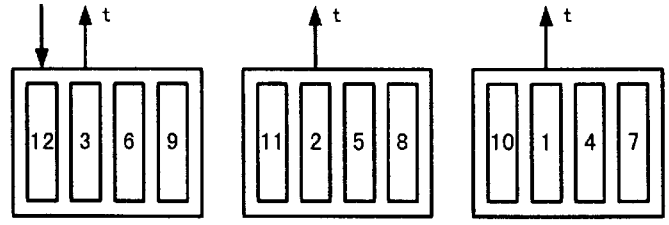
Figure 12G:
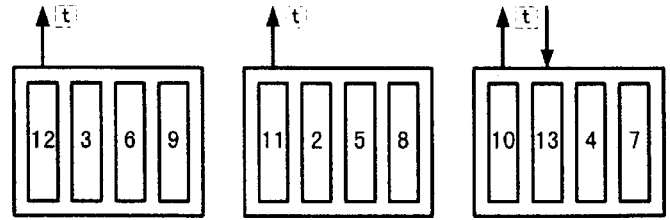

Timings for the memory operation based on the control circuit 101 are shown in FIG. 10. The tracing circuit 102 executes the tracing operation as many as three times in accordance with the read path selection information s105, s106, and s107 which is outputted from the RAMs 10, 11, and 12 and trace starting state information s108 which is formed by the control circuit 101. A result is inputted as a trace result signal s109 to the control circuit s101. While initializing the trace starting state every cut length/2 clocks on the basis of the trace result signal s109 and a maximum likelihood state signal s101, the control circuit s101 obtains the trace starting state of the next clock.

Such a memory operation will now be more specifically explained with reference to FIGS. 11A to 11F and FIGS. 12A to 12G. FIGS. 11A to 11F and FIGS. 12A to 12G show the writing/reading operations for the RAMs 10, 11, and 12 at continuous times. As mentioned above, those three RAMs are dual-port RAMs of the number of bits=8 and the number of words=4. Because of a limitation of a drawing space, states of times 1 to 6 are shown in FIGS. 11A to 11F and states of times 7 to 13 are shown in FIGS. 12A to 12G. It is now assumed that all of the addresses in each memory are sequentially allocated to 0, 1, 2, and 3 from the left. The path selection information is sequentially written into each RAM until times 1, 2, 3, ..., and 9 and three addresses are written with respect to each RAM at time 9.

The operation at time 10 and subsequent times is shown in FIG. 10. In the head clock in FIG. 10 corresponding to time 10, storage contents (three path selection information 9, 8, 7) are read out from address 3 in each RAM and the tracing is performed. At the same time, the subsequent path selection information 10 is written into address 0 in the RAM 12. In FIGS. 11A to 11F and FIGS. 12A to 12G, 't' added to a reading arrow denotes that the tracing is executed and 'd' indicates that the tracing is performed and the decoding is executed.

In the second clock in FIG. 10 corresponding to time 11, the storage contents (three path selection information 6, 5, 4) are read out from addresses 2 in the RAMs and the tracing is executed. At the same time, the subsequent path selection information 11 is written into address 0 in the RAM 11. Further, In the third clock in FIG. 10 corresponding to time 12, the storage contents (path selection information 3, 2, 1) are read out from addresses 1 in the RAMs and the tracing is executed. After that, the decoding operations corresponding to the path selection information 1 to 9 are executed. At the same time, the subsequent path selection information 12 is written into address 0 in the RAM 12. In the fourth clock in FIG. 10 corresponding to time 13, the storage contents (three path selection information 10, 11, 12) are read out from addresses 0 in the RAMs and the tracing and the initialization of the trace starting state are executed. At the same time, the subsequent path selection information 13 is written into address 1 in the RAM 12.

As mentioned above, the decoding and the initialization of the trace starting state in the clock subsequent to it are executed once every three clocks. The subsequent path selection information as much as one address is inputted at any clock.

On the other hand, the trace starting state information s108 is also inputted to an output buffer 103. In the output buffer 103, lower three bits of the trace starting state information s108 after the tracing was performed by an amount corresponding to the cut length or more are stored as decoding bits and are rearranged in accordance with the inherent order of the time series. After that, they are outputted as a decoding bit signal s110. By the construction as mentioned above, as for the access to each RAM, while keeping the access to once every clock, the total number of words in the RAM in the path memory circuit can be set to (the cut length)×2. Thus, the circuit scale of the Viterbi decoding apparatus can be reduced.

The tracing circuit 102 will now be described. Since the tracing is executed in accordance with the order of the RAM 10→RAM 11→RAM 12, the path selection information of which state is selected from the path selection information s105 is determined by the trace starting state information s108. The numbers of candidates of the states to be selected from the path selection information s106 and s107 can be suppressed to 2 and 4 by the trace starting state information s108, respectively (refer to FIG. 13). The tracing circuit 102 is constructed by using this nature.

Figure 14:
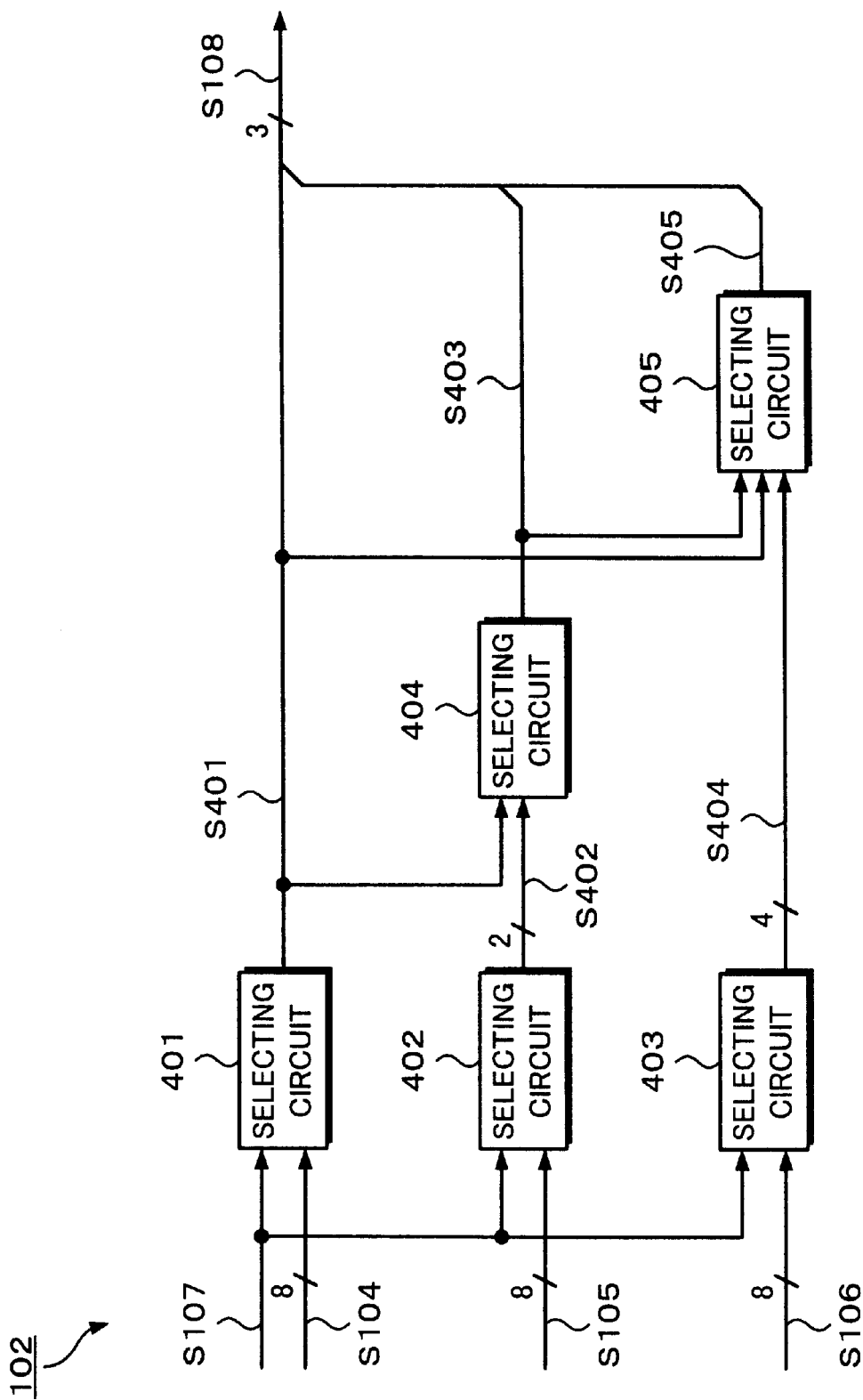
FIG. 14 is a block diagram for explaining a tracing circuit in the embodiment of the invention.

FIG. 14 shows a construction of the tracing circuit 102. The path selection information s105, s106, and s107 which is inputted from the RAMs 10, 11, and 12 is inputted to selecting circuits 401, 402, and 403, respectively. On the other hand, the trace starting state information s107 is also inputted to the selecting circuits 401, 402, and 403. The selecting circuit 401 selects the path selection information of the state to be traced from the path selection information s104 in accordance with the trace starting state information s107 and outputs as trace result information s401. The selecting circuit 402 selects the path selection information of two states having a possibility such that it is traced from the path selection information s105 in accordance with the trace starting state information s107 and outputs as pre-trace information s402.

The pre-trace information s402 is inputted to the selecting circuit 404. The trace result information s401 is further inputted to the selecting circuit 404. The selecting circuit 404 selects the path selection information of the state to be traced in accordance with the trace result information s401 and outputs as trace result information s403. The selecting circuit 403 selects the path selection information of four states having a possibility such that it is traced from the path selection information s106 in accordance with the trace starting state information s107 and outputs as pre-trace information s404. The pre-trace information s404 is inputted to the selecting circuit 405. The trace result information s401 and s403 is further inputted to the selecting circuit 405. The selecting circuit 405 selects the path selection information of the state to be traced in accordance with the trace result information s401 and s403 and outputs as trace result information s405. Finally, the trace result information s401, s403, and s405 is outputted as a trace result signal s109 in a lump with respect to three bits.

With the construction of the tracing circuit 102 as mentioned above, in the embodiment of the invention, even if the tracing operation as many as a plurality of times is executed, a delay corresponding to two stages of selectors merely occurs as compared with the case of performing the tracing as many as one time. The decoding operating speed can be hardly deteriorated.

Figure 15:
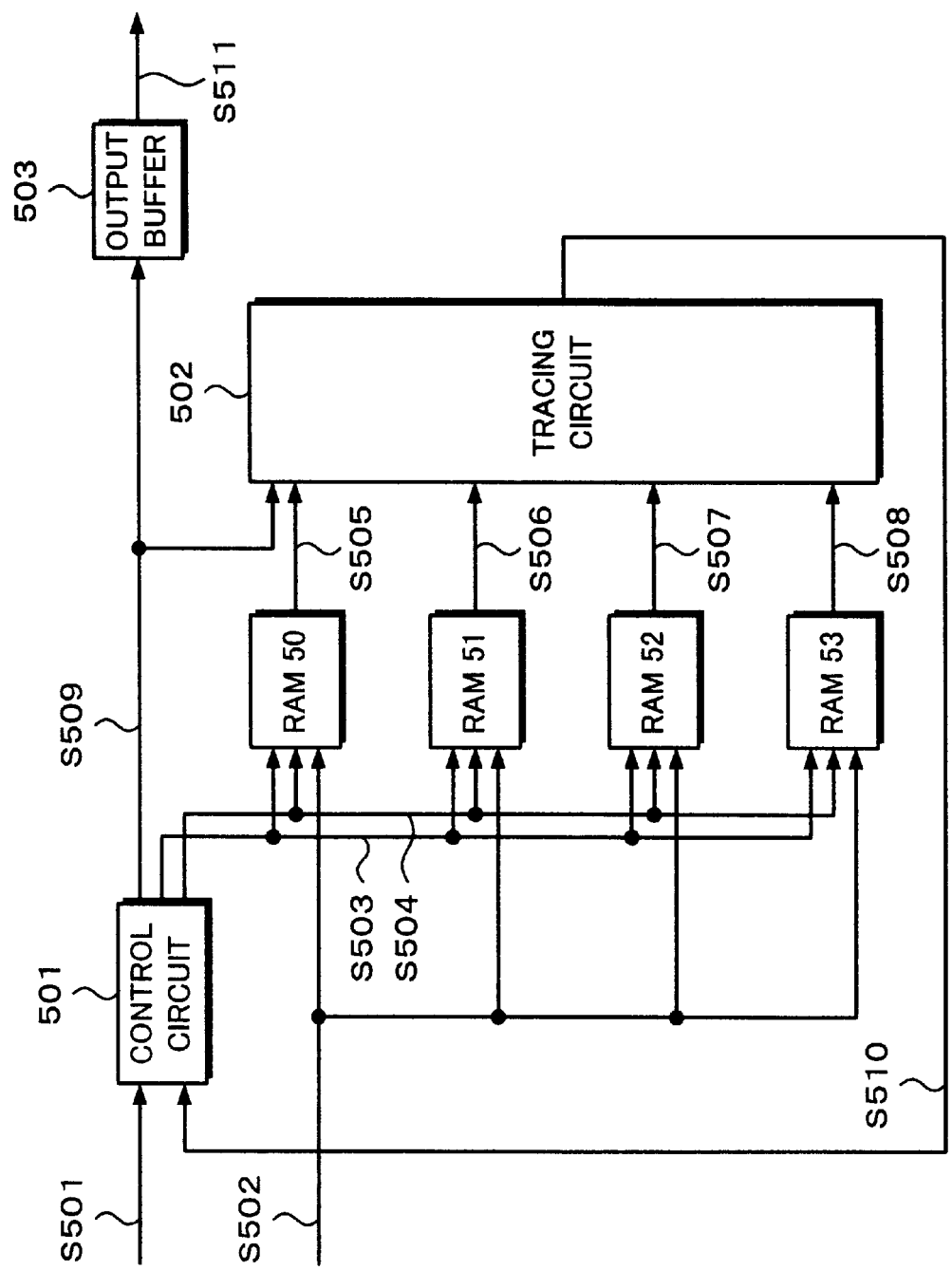
FIG. 15 is a block diagram for explaining a path memory circuit in another embodiment of the invention.

The embodiment of the invention mentioned above uses a path memory circuit which has three dual-port RAMs of 1-write and 1-read and executes the tracing as many as three times for a period of time of one clock. On the other hand, another embodiment of the invention using a path memory circuit having a different construction is also possible. FIG. 15 shows a construction of the path memory circuit in another embodiment of the invention. The path memory circuit is a circuit which has four single-port RAMs RAM 50, RAM 51, RAM 52, and RAM 53. of the number of bits=8 and the number of words=3 and executes the tracing as many as three times for a period of time of one clock in case of performing the decoding of the traceback depth=6 for a code of the constraint length=4.

Path selection information s502 which is inputted from the ACS circuit is sequentially stored into the RAMs every clock in accordance with the order of RAM 53→RAM 52→RAM 51→RAM 50→RAM 53→••• in response to a write control signal s503. As for the RAMs 50, 51, 52, and 53, the path selection information is read out from the three RAMs every clock in response to a read control signal s504 and path selection information s505, s506, s507, and s508 is outputted. The path selection information s505, s506, s507, and s508 is inputted to a tracing circuit 502. The write control signal s503 and read control signal s504 are formed by a control circuit 501 and inputted to the RAMs 50, 51, 52, and 53, respectively. Timings of the memory operation based on the control circuit 501 are shown in FIG. 16.

In the tracing circuit 502, the tracing as many as three times is executed in accordance with the path selection information s505, s506, s507, and s508 which is outputted from the RAMs 50, 51, 52, and 53 and trace starting state information s509 which is formed by the control circuit 501 and its result is inputted as a trace result signal s510 to the control circuit 501. The tracing circuit 502 can be constructed by combining, for example, the selecting circuits as used in the tracing circuit 102 in the embodiment of the invention shown in FIG. 14. In the control circuit 501, the trace starting state of the next clock is obtained while initializing the trace starting state every (traceback depth)/2 on the basis of the trace result signal s510 and a maximum likelihood state signal s501.

Such a memory operation will now be specifically explained with reference to FIGS. 17A to 17F and FIGS. 18A to 18G. FIGS. 17A to 17F and FIGS. 18A to 18G show the writing/reading operations for the RAMs 50, 51, 52, and 53 at continuous times. As mentioned above, those four RAMs are single-port RAMs of the number of bits=8 and the number of words=3. For the purpose of saving of a drawing space, the states at time 1 to time 6 are shown in FIGS. 17A to 17F and the states at time 7 to time 13 are shown in FIGS. 18A to 18G. It is now assumed that all of the addresses in each memory are allocated to 0, 1, and 2 in accordance with the order from the left. The path selection information is sequentially written into each RAM until times 1, 2, 3, . . . , and 9. At time 9, information is written into two addresses with respect to each RAM.

Figure 16:
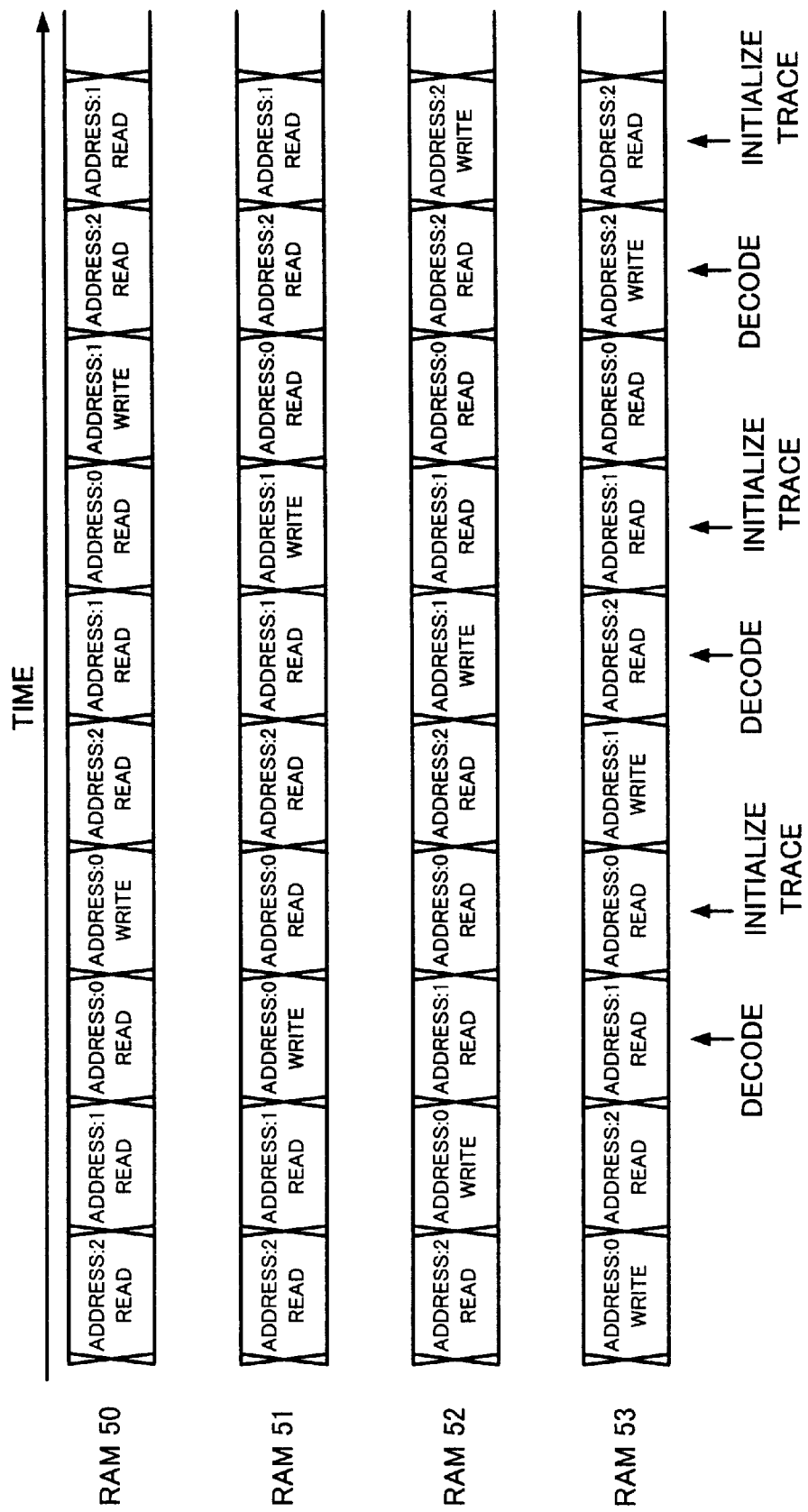
FIG. 16 is a schematic diagram for explaining the memory operation in the other embodiment of the invention.

The operation after time 10 subsequent to the above state is shown in FIG. 16. In the head clock in FIG. 16 corresponding to time 10, the storage contents (path selection information 9, 8, 7) are read out from addresses 2 in the three RAMs (namely, RAM 50, RAM 51, RAM 52) and the tracing is performed. At the same time, the subsequent path selection information 10 is written into address 0 in one RAM (namely, RAM 53). 't' added to a reading arrow denotes that the tracing is executed and 'd' indicates that the tracing is performed and the decoding is executed.

In the second clock in FIG. 16 corresponding to time 11, the storage contents (path selection information 6, 5, 4) are read out from addresses 2 in the three RAMs (namely, RAM 50, RAM 51, RAM 53) and the tracing is executed. At the same time, the subsequent path selection information 11 is written into address 0 in one RAM (namely, RAM 11). The reading operation in this instance is executed with respect to addresses 1 with regard to the two RAMs (RAM 50, RAM 51) and is performed with regard to address 2 as for the other one RAM (RAM 53).

Further, in the third clock in FIG. 16 corresponding to time 12, the storage contents (path selection information 3, 2, 1) are read out from addresses 2 in the three RAMs (namely, RAM 50, RAM 52, RAM 53) and the tracing is executed. After that, the decoding operations corresponding to the path selection information 1 to 9 are executed. At the same time, the subsequent path selection information 12 is written into address 0 in the other one RAM (namely, RAM 51). The reading operation in this instance is executed with respect to addresses 1 with regard to the two RAMs (RAM 52, RAM 53) and is performed with regard to address 0 as for the other one RAM (RAM 51).

In the fourth clock in FIG. 16 corresponding to time 13, the storage contents (path selection information 10, 11, 12) are read out from addresses 0 in the three RAMs (namely, RAM 51, RAM 52, RAM 53) and the tracing and the initialization of the trace starting state are executed. At the same time, the subsequent path selection information 13 is written into address 0 in the other one RAM (namely, RAM 50).

The decoding and the initialization of the trace starting state in the clock subsequent to the decoding are executed once every three clocks as mentioned above. At any one of the clocks, the subsequent path selection information as much as one address is inputted.

On the other hand, the trace starting state information s509 is also inputted to an output buffer 503. The output buffer 503 stores lower three bits of the trace starting state information s507 after the tracing over the cut length was performed as decoding bits and rearranges them in accordance with the inherent time series and, after that, outputs as a decoding bit signal s511.

As mentioned above, even in the other embodiment of the invention, as for the accesses to each RAM, the total number of words in the RAM of the path memory can be set to (the traceback depth)×2 while setting the number of accesses to one time with respect to each clock. According to the path memory circuit in the other embodiment of the invention, since only the single-port memories are used, the circuit scale can be further reduced as compared with the embodiment of the invention described above with reference to FIG. 9 or the like. Further, in the tracing circuit 502, by preliminarily restricting the number of candidates of the states in a manner similar to the tracing circuit 102 in the path memory circuit 705 in the embodiment of the invention, the increase in the delay can be minimized.

Although the embodiment of the invention and the other embodiment of the invention mentioned above have been described with respect to the case where the constraint length=4 and the traceback depth=6, the constraint length and the traceback depth are not limited to those values but can be set to arbitrary values. Although the embodiment and the like of the invention have been shown with respect to the case of performing the tracing operation as many as three times every clock as an example, for instance, various modifications such that the tracing operation as many as four times is executed every clock by a construction having four dual-port RAMs, the tracing operation as many as four times is executed every clock by a construction having five single-port RAMs, and the like are possible.

As mentioned above, according to the invention, since the tracing operation as many as a plurality of times is executed for a period of time of one clock and the decoding is executed, the total number of words of the RAM in the path memory circuit can be reduced. Therefore, it is possible to contribute to the reduction of the circuit scale of the apparatus.

Since the number of times of access to each RAM at every clock is equal to once and the increase in delay is minimized by the foregoing construction of the tracing circuit, the high speed decoding operation can be performed.

Therefore, according to the invention, the Viterbi decoding apparatus in which a circuit scale is small and the high speed operation can be performed can be provided.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A Viterbi decoding apparatus which has a path memory for storing selection information of a path for each transition state of a convolution code and which traces the information held in the path memory by an amount corresponding to a traceback depth, thereby performing a Viterbi decoding, wherein the path memory comprises:

a plurality of single-port rewritable memories for performing tracing operations as many as a plurality of times and decoding operations for a period of time of one clock and memory control means for controlling access to said plurality of single-port rewritable memories, such that performance of only one read operation or write operation happens on each of the plurality of single-port rewritable memories during a single clock, wherein said memory control means controls said plurality of rewritable memories so as to sequentially write when the path selection information is written into said plurality of rewritable memories and to sequentially read out from said plurality of rewritable memories at the time of tracing, and wherein the number of said single-port rewritable memories minus one is as many times as the tracing operations occur during the period of time of one clock.

2. An apparatus according to claim 1, wherein when the path selection information is sequentially read out from said plurality of rewritable memories and the tracing operations as many as said plurality of times are executed by said memory control means, among the path selection information that is read out from each of said plurality of rewritable memories, information of a state having a possibility of tracing is preliminarily selected on the basis of a trace starting state and the tracing is performed with respect to said information of a state that has been selected.

3. A Viterbi decoding method of storing selection information of a path for each transition state of a convolution code and tracing the stored information by an amount corresponding to a traceback depth, thereby performing a Viterbi decoding, comprising a tracing step of performing tracing operations as many as a plurality of times for a period of time of one clock using a plurality of single-port rewritable memories provided in a path memory, such that performance of only one read operation or write operation happens on each of the plurality of single-port rewritable memories during a single clock, wherein said tracing step further comprises performing the tracing operations as many times as the number of single-port rewritable memories minus one during the period of time of one clock.

4. A method according to claim 3, further comprising a writing step of sequentially writing into said plurality of rewritable memories when the path selection information is written.

5. A method according to claim 4, wherein in said tracing step a reading operation is sequentially performed from said plurality of rewritable memories, thereby performing the tracing operations as many as said plurality of times.

6. A method according to claim 5, wherein in said tracing step in the path selection information which is read out from each of said plurality of rewritable memories, information of a state having a possibility of tracing is preliminarily selected on the basis of a trace starting state and the tracing is performed with respect to the information of the selected state.

* * * * *